(12) United States Patent
Feng

(10) Patent No.: US 6,748,180 B2
(45) Date of Patent: Jun. 8, 2004

(54) CAPACITOR REGULATED HIGH EFFICIENCY DRIVER FOR A LIGHT EMITTING DIODE

(75) Inventor: Kai D. Feng, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 667 days.

(21) Appl. No.: 09/772,948

(22) Filed: Jan. 31, 2001

(65) Prior Publication Data

US 2002/0012151 A1 Jan. 31, 2002

(30) Foreign Application Priority Data

Jun. 13, 2000 (CA) ............................................. 2311435

(51) Int. Cl.[7] ............................................. H04B 10/04
(52) U.S. Cl. ........................ 398/182; 398/183; 398/186; 398/192; 398/195; 398/197; 398/201; 372/38; 372/29; 372/34; 372/32; 372/36; 372/25; 372/33; 372/26
(58) Field of Search ................................. 398/182, 183, 398/186, 192, 195, 197, 201; 372/38, 34, 36, 29, 25, 26, 33, 32

(56) References Cited

U.S. PATENT DOCUMENTS 5,721,456 A * 2/1998 Kebukawa .................... 398/182
6,567,199 B1 * 5/2003 Nakaoka et al. ............. 398/183

* cited by examiner

*Primary Examiner*—Leslie Pascal
*Assistant Examiner*—Hanh Phan
(74) *Attorney, Agent, or Firm*—Wan Yee Cheung, Esq.; McGinn & Gibb, PLLC

(57) ABSTRACT

A high efficiency light emitting diode (LED) driver circuit utilizes a capacitor to regulate the LED driving current. The voltage across the capacitor is monitored to maintain a preselected low threshold voltage on the capacitor, which determines the LED optical emission intensity. The capacitor provides the LED driver current by discharging through the LED during transmission intervals, and the power supply for the device is used only to maintain the capacitor charge level. The LED driver circuit accordingly operates at high efficiency with low power consumption. The LED driver current can be regulated by changing the low and high threshold voltages of the capacitor pump controller, thereby to control the optical intensity of the LED.

20 Claims, 1 Drawing Sheet

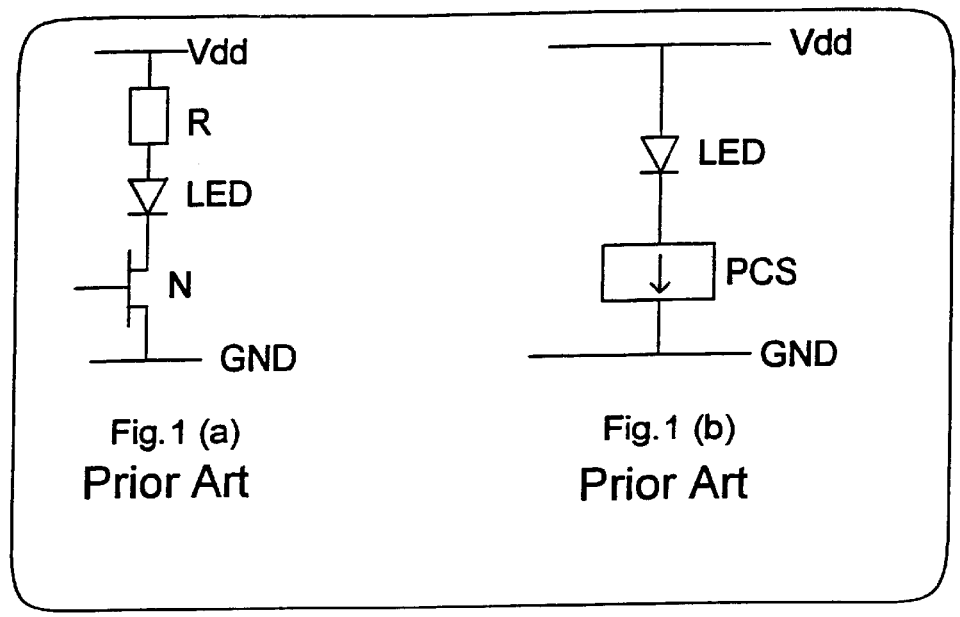
Fig. 1 (a) Prior Art
Fig. 1 (b) Prior Art
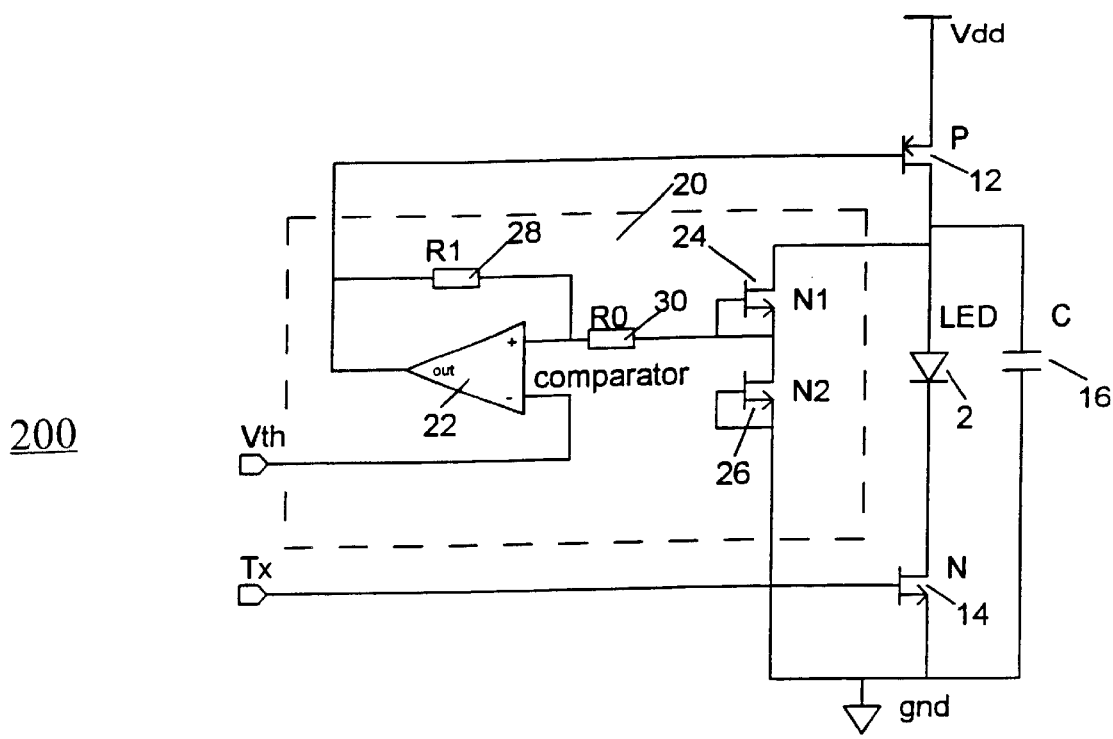
Fig. 2

US 6,748,180 B2

CAPACITOR REGULATED HIGH EFFICIENCY DRIVER FOR A LIGHT EMITTING DIODE

BACKGROUND OF THE INVENTION

1. Field of the Invention

This invention relates to light emitting diodes, and more particularly to a capacitor-regulated high efficiency driver for a light emitting diode.

2. Description of the Related Art

A light emitting diode (LED) driver in a photoelectric transceiver (e.g., an infrared IR transceiver) is critical to the transmitting operation of the transceiver. The LED driver requires the highest operating current of any component in the transceiver. Typically, the peak current of the LED driver can reach 500 mA or more. Since many infrared transceivers are battery operated, the current draw of the LED driver is an important concern.

Therefore, enhancing the efficiency of the LED driver to reduce power consumption would be a considerable advantage, particularly where the IR transceiver is used in telephone or computer network applications. While in data communications applications the IR transceiver is in the receive mode most of the time, in telephone or synchronized network applications the transceiver is typically in the transmit mode for most of its operating time.

FIG. 1A illustrates a conventional switching LED driver, comprising an external resistor R and an N-type field effect transistor (FET) N. When the gate of the FET is low, the FET is turned off, and no current flows through the LED. When the gate of the FET is high, the FET is turned on, and a current flows between $V_{dd}$ and ground to illuminate the LED. The FET has a very low on-resistance, usually less than 0.1 ohm. Thus, the current depends on the forward voltage $V_f$ of the LED and the resistance of an external resistor R:

$$I_{LED}=(V_{dd}-V_f)/(R_{on}+R) \qquad (1)$$

where $I_{LED}$ is the current through the LED, $V_f$ is the forward voltage of the LED, and $R_{on}$ is the on-resistance of the FET.

This circuit is relatively simple, and provides the additional advantage that the IR transceiver internal power consumption excludes the power consumption of the resistor R. However, from the standpoint of power conservation there are significant disadvantages to this circuit. For example, the LED driving current depends on the voltage $V_{dd}$, which is not controllable. Further, the power efficiency of the circuit is low because the power consumption of the resistor R constitutes a large portion of the power provided by $V_{dd}$.

A simple calculation shows that the ratio of the power consumption on resistor R to the total power supplied by $V_{dd}$ is $$P_R/P_O=(R*(V_{dd}-V_f))/(V_{dd}*(R_{on}+R)) \qquad (2)$$

where $P_R$ is the power consumption of resistor R, and $P_O$ is the total power provided by $V_{dd}$.

Usually R>>$R_{on}$, so equation (2) can be reduced to $$P_R/P_O=(V_{dd}-V_f)V_{dd}=1-V_f/V_{dd}.$$

Thus, for example, if $V_{dd}$=5 V and $V_f$=2 V at 500 mA, this ratio is 3/5 which means more than one half of the total power supplied by $V_{dd}$ is dissipated by resistor R.

The dependency of the LED driving current on $V_{dd}$ can be seen in the following example. If $V_{dd}$ ranges from 4.5 V to 5.5 V, $R_{on}$ is 0.1 ohm, and an LED driving current $I_{LED}$ of 500 mA is required, the resistance of the resistor R should be 4.9 ohms to generate the LED driving current $I_{LED}$ of 500 mA at 4.5 V, which is the low value of $V_{dd}$. At 5.5 V, the high value of $V_{dd}$, the current would increase to 700 mA if $V_f$ remains constant. Thus, fluctuations in the supply voltage $V_{dd}$ directly affect the LED driving current, and the optical intensity of the LED will vary accordingly.

FIG. 1B shows a conventional pulsed current source (PCS) LED driver which holds the LED current constant, independent of $V_{dd}$. However, in this circuit, the IR transceiver internal power consumption is very high. The ratio of the power consumption $P_{PCS}$ of the pulsed current source to the total power provided by the power supply $V_{dd}$ is $$P_{PCS}/P_O=1-V_f/V_{dd} \qquad (3)$$

Thus, in this circuit, the IR chip internal power consumption is very high, which causes significant thermal problems.

SUMMARY OF THE INVENTION

In view of the foregoing and other problems, disadvantages, and drawbacks of the conventional methods and structures, an object of the present invention is to provide a driver circuit for a light emitting diode, which overcomes the above problems.

Another object is to provide a high efficiency LED driver circuit which utilizes a capacitor to regulate the LED driving current, which provides high efficiency and low power consumption. The capacitor provides the LED driver current by discharging through the LED during transmission intervals, and the power supply for the device maintains the capacitor voltage. The capacitor charges to a preselected high threshold voltage, which determines the maximum LED optical emission intensity. As the charge depletes during transmit intervals, the capacitor discharges to a preselected low threshold voltage, at which point the capacitor pump controller opens a charge path from the power supply to recharge the capacitor.

The LED driver circuit of the invention accordingly operates at high efficiency with low power consumption. Moreover, the LED driver current can be regulated by changing the low threshold voltage and the high threshold voltage, thereby to control the optical intensity of the LED.

In a first aspect, the present invention provides a driver circuit for a light emitting diode in an optical transmitter which converts an electrical signal into an optical signal. The driver circuit includes a capacitor having one side connected to a higher voltage terminal of a power supply through a charge switch, a second side of the capacitor being connected to a lower voltage terminal of the power supply, the anode of the light emitting diode being connected to a connection point of the charge switch and the capacitor, the cathode of the light emitting diode being connected to a lower voltage terminal of the power supply through a discharge switch, and a controller for closing the charge switch to charge the capacitor when a voltage on the capacitor reaches a preset low voltage threshold and for opening the charge switch when the voltage on the capacitor reaches a preset high voltage threshold. The discharge switch is closed responsive to an intensity of the electrical signal and the capacitor thereby discharges through the light emitting diode to emit an optical signal corresponding to the electrical signal.

In another aspect, an optical transmitter is provided, which includes a light emitting diode, and a driver circuit for activating the light emitting diode responsive to an electrical signal. The driver circuit includes a capacitor having one side connected to a higher voltage terminal of a power supply through a charge switch, a second side of the capacitor being connected to a lower voltage terminal of the power supply, the anode of the light emitting diode being connected to a connection point of the charge switch and the capacitor, the cathode of the light emitting diode being connected to a lower voltage terminal of the power supply through a discharge switch, and a controller for closing the charge switch to charge the capacitor when a voltage on the capacitor reaches a preset low voltage threshold and for opening the charge switch when the voltage on the capacitor reaches a preset high voltage threshold. The discharge switch is closed responsive to an intensity of the electrical signal and the capacitor thereby discharges through the light emitting diode to emit an optical signal corresponding to the electrical signal.

In further exemplary aspects of the invention, the discharge switch preferably includes an N-type FET having a drain connected to a cathode of the light emitting diode, a source connected to the lower voltage terminal of the power supply and a gate connected to the electrical signal.

Preferably, the controller includes a voltage comparator having a positive input connected to an output of the comparator through a resistor and connected to the capacitor through a comparator input resistor, an output signal of the comparator controlling the charge switch and a threshold voltage applied to the comparator determining the preset low voltage threshold and the preset high voltage threshold.

The controller may further include a voltage divider applying a divided voltage to the comparator input resistor. The voltage divider preferably includes a first N-type FET having a drain connected to the capacitor, and a source and gate connected to the comparator input resistor and to a drain of a second N-type FET, a source and gate of the second N-type FET being connected to the lower voltage terminal of the power supply.

Preferably, the charge switch includes a P-type FET having a source connected to the higher voltage terminal of the power supply, a drain connected to the capacitor, and a gate connected to the output of the comparator.

The present disclosure relates to subject matter contained in Canadian Patent Application No. 2,311,435, filed Jun. 13, 2000, which is expressly incorporated herein by reference in its entirety.

BRIEF DESCRIPTION OF THE DRAWINGS

The foregoing and other purposes, aspects and advantages will be better understood from the following detailed description of a preferred embodiment of the invention with reference to the drawings, in which:

FIG. 1A is a block diagram of a conventional switching LED driver circuit;

FIG. 1B is a block diagram of a conventional pulse current LED driver circuit; and FIG. 2 is a schematic diagram of an LED driver circuit according to the present invention.

DETAILED DESCRIPTION OF A PREFERRED EMBODIMENT OF THE INVENTION

Referring now to the drawings, and more particularly to FIG. 2, there is shown a preferred embodiment of the method and structure according to the present invention.

In FIG. 2, a LED driver circuit 200 includes a charge switch 12 (which preferably includes a P-type FET), a discharge switch 14 (which preferably includes an N-type FET), a capacitor 16, and a capacitor pump controller 20. The PFET 12 and the NFET 14 have a very low on-resistance (e.g., in the order of 0.1 ohm).

The source of the PFET 12 is connected to the higher voltage terminal of the power supply $V_{dd}$, and the drain of the PFET 12 is connected to the anode of the LED 2. The cathode of the LED 2 is connected to the drain of the NFET 14, and the source of the NFET 14 is connected to the lower voltage terminal of the power supply, which in the exemplary, non-limiting embodiment shown is ground GND. It will be appreciated that the lower voltage terminal need not be grounded, but can be any lower voltage line in the device which provides a sufficient voltage between $V_{dd}$ and GND to charge the capacitor 16.

One side of the capacitor 16 is connected to the drain of the PFET 12 and the other side of the capacitor 16 is connected to ground GND. Thus, a capacitor charge path is created between the supply voltage $V_{dd}$ and ground GND for maintaining a charge on the capacitor 16, with the capacitor charge path being controlled by the charge switch PFET 12.

The cathode of the LED 2 is connected to the drain of the NFET 14, and the source of the NFET 14 is connected to the lower voltage terminal GND. Thus, a capacitor discharge path is created through the LED 2 to ground GND, with the capacitor discharge path being controlled by the discharge switch NFET 14.

As shown in FIG. 2, the capacitor pump controller 20 preferably includes a voltage comparator 22 and a voltage divider, preferably including N-type FETs 24, 26. The advantages of an N type FET voltage divider over a resistor voltage divider include very high equivalent resistance, extremely low leakage current and very small size. Feedback resistor 28 connects the output of comparator 22 to its compare input, which is connected to the source of NFET 24 through resistor 30. The source of NFET 24 is connected to the drain of NFET 26, and the sources of the NFETs 24, 26 are connected to their respective gates. The feedback resistor 28 and input resistor 30 provide a hysteresis performance to the comparator 22, so that the comparator 22 has a high threshold of $(1+R30/R28)*V_{th}$ and a low threshold of $(1+R30/R28)*V_{th}-(1+R30/R28)*V_{dd}$. Thus, the capacitor pump controller 20 controls the charging and discharging of the capacitor 16 as described below.

That is, when the IR transceiver chip is first powered on, the voltage on the capacitor 16 is zero. With no voltage at the positive input of comparator 22, the comparator output is low and the gate of PFET 12 is held low, so the charge switch PFET 12 is closed and the charge current from the supply voltage $V_{dd}$ flows through the charge path to charge the capacitor 16. Discharge switch NFET 14 remains off because there is no transmit signal $T_x$ on the gate of NFET 14. The voltage on capacitor 16 is divided by NFETs 24, 26, and the divided voltage is applied to the comparator input resistor 30.

As the capacitor 16 is charged, the voltage on the capacitor 16 rises, and the divided voltage at the comparator input resistor 30 rises. The capacitor 16 continues being charged until the divided voltage on the comparator input resistor 30 reaches the high threshold, which determines the maximum optical emission intensity of the LED 2.

When the voltage at the input resistor 30 of the comparator 22 rises above the high threshold voltage, the output of the comparator 22 goes high. The voltage from the comparator output on the gate of PFET 12 turns off PFET 12 and opens the charge path. Since the on-resistance of the PFET 12 can be as low as 0.1 ohm, even a capacitor 16 having a capacitance in the order of 100 μF can be charged to any voltage up to 0.9* $V_{dd}$ within a period of about 30 μs.

The comparator output remains high during receive intervals of the IR transceiver. With the voltage on the capacitor 16 above the low threshold voltage, the charge switch PFET 12 remains off. When there is no transmit signal $T_x$ present, the gate voltage of NFET 14 is low, so NFET 14 is also turned off. The circuit is quiescent and capacitor 16 is isolated and retains its charge. Because the input impedance of the capacitor pump controller 20 is very high, the leakage current is very low and the capacitor 16 can retain its charge for long intervals.

During transmit intervals the electrical transmit signal $T_x$ is applied to the gate of the discharge switch NFET 14, turning on the NFET 14 and closing the capacitor discharge path. The capacitor 16 discharges through the LED 2 and NFET 14, transmitting optical pulses corresponding to the electrical transmit signal $T_x$. As the charge on the capacitor 16 depletes, the voltage through NFETs 24, 26 decreases. The voltage is divided by NFETs 24 and 26, and thus the voltage at the input of the comparator 22 drops. When the voltage at the input of the comparator 22 falls below the low threshold voltage, the comparator 22 output to the gate the PFET 12 goes low, which turns on the PFET 12 and closes the capacitor charge path to recharge the capacitor 16. The capacitor 16 continues to charge until the voltage at the input of the comparator 22 once again rises above the high threshold voltage and the output of the comparator 22 goes high to turn off the PFET 12.

Because the voltage curve at the NFETs 24, 26 connection point follows the charge and discharge curve of the capacitor 16, the voltage on the capacitor 16 is always kept within the maximum level and minimum level which depend upon the threshold voltage $V_{th}$ and the hysteresis of the comparator 22.

The voltage drop during the LED 2 pulse duration is a primary consideration. It can be expressed as $$\Delta V = \Delta Q/C \quad (4)$$

where
$\Delta V$ is the voltage change across the capacitor 16,
$\Delta Q$ is the charge change in the capacitor 16, and
C is the capacitance of the capacitor 16.

Where the capacitance of capacitor 16 is 10 μF, the LED current is 500 mA and the pulse duration is 125 ns (e.g., in fast infrared (FIR) systems), the voltage drop across the capacitor 16 is $(0.5*125e^{-9}/10e^{-6})=6.25$ mV, and can be ignored.

Where the pulse duration is long (e.g., in slow infrared (SIR) systems) with a pulse duration in the order of 19 μs, a small voltage drop can be maintained through the use of large capacitance (e.g., 100 μF). A simple calculation using equation (4) shows the voltage drop during a 19 μs pulse is 95 mV, which is within acceptable limits.

Another way to maintain a low voltage drop is through on-line charging of the capacitor 16, in which case a capacitor 16 with a small capacitance can be used. The circuit can be modified so that when the capacitor pump controller 20 detects that the voltage on the capacitor 16 is below the low voltage threshold during transmit intervals, while the NFET 14 is active the capacitor pump controller 20 can turn on the PFET 12 as well to charge the capacitor 16. Since the on-resistance of the PFET 12 is very small, the voltage on the capacitor 16 increases very quickly. When the voltage on the capacitor 16 reaches the high voltage threshold, the capacitor pump controller 20 turns off the PFET 12 to open the capacitor charge path, and a small ripple is seen on the capacitor voltage. In this embodiment, if the voltage on the capacitor 16 drops below the low voltage threshold, the capacitor pump controller 20 signals the IR transceiver controller to delay further transmission until the voltage on the capacitor 16 reaches the high voltage threshold.

It will be apparent from the aforesaid description that the driver circuit of the invention operates with a very high efficiency. During the discharge interval the total power $P_O$ is determined by the formula $$P_O = I_{LED} * V_C \quad (5)$$

where $I_{LED}$ is the LED driving current, and
$V_C$ is the voltage on the capacitor 16.

Because of very low on-resistances of the PFET 12 and the NFET 14, the power $P_N$ on the NFET 14 is $$P_N = (I_{LED})^2 * R_{onN}$$

where
$R_{onN}$ is the on-resistance of the NFET 14.

Since the average charge current should be the same as the average discharge current, as long as the PFET 12 has the same on-resistance as the NFET 14 the total power consumption $P_d$ of the driver is twice that of $P_N$, so that $$P_d = 2*(I_{LED})*R_{onN}/V_C \quad (6)$$

If, for example, $I_{LED}=500$ mA, $V_C=2$V and $R_{onN}=0.1$ ohm, the ratio $P_d/P_O$ is 0.05, which is much lower than a conventional LED driver.

The LED driver current can be regulated by changing the low voltage threshold and the high voltage threshold. This is accomplished by altering the threshold voltage $V_{th}$ at the reference input of the comparator 22, which causes the comparator output to go high at a different voltage level, raising or lowering the high and low voltage thresholds of the capacitor 16 commensurately.

While the invention has been described in terms of a preferred embodiment, those skilled in the art will recognize that the invention can be practiced with modification within the spirit and scope of the appended claims.

Having thus described my invention, what I claim as new and desire to secure by Letters Patent is as follows:

1. A driver circuit for a light emitting diode in an optical transmitter which converts an electrical signal into an optical signal, comprising:

a charge switch;

a capacitor having a first side connected to a higher voltage terminal of a power supply through said charge switch;

a discharge switch coupled to a lower voltage terminal of said power supply, a second side of the capacitor being connected to said lower voltage terminal of the power supply, the anode of the light emitting diode being connected to a connection point of the charge switch and the capacitor, the cathode of the light emitting diode being connected to said lower voltage terminal of the power supply through said discharge switch; and a controller for closing the charge switch to charge the capacitor when a voltage on the capacitor reaches a preset low voltage threshold and for opening the charge switch when the voltage on the capacitor reaches a preset high voltage threshold, wherein the discharge switch is closed responsive to an intensity of the electrical signal and the capacitor thereby discharges through the light emitting diode to emit an optical signal corresponding to the electrical signal.

2. The driver circuit of claim 1, wherein the discharge switch comprises an N-type FET having a drain connected to a cathode of the light emitting diode, a source connected to the lower voltage terminal of the power supply and a gate connected to receive the electrical signal.

3. The driver circuit of claim 1, wherein the controller comprises a voltage comparator having a positive input connected to an output of the voltage comparator through a resistor and connected to the capacitor through a comparator input resistor, an output signal of the voltage comparator controlling the charge switch and a threshold voltage applied to the voltage comparator determining the preset low voltage threshold and the preset high voltage threshold.

4. The driver circuit of claim 3, wherein the controller further comprises a voltage divider applying a divided voltage to the comparator input resistor.

5. The driver circuit of claim 4, wherein the voltage divider comprises a first N-type FET having a drain connected to the capacitor, and a source and gate connected to the comparator input resistor and to a drain of a second N-type FET, a source and gate of the second N-type FET being connected to the lower voltage terminal of the power supply.

6. The driver circuit of claim 4, wherein the charge switch comprises a P-type FET having a source connected to the higher voltage terminal of the power supply, a drain connected to the capacitor, and a gate connected to the output of the voltage comparator.

7. An optical transmitter, comprising:

a light emitting diode; and a driver circuit for activating the light emitting diode responsive to an electrical signal, the driver circuit comprising:

a charge switch;

a capacitor having a first side connected to a higher voltage terminal of a power supply through said charge switch;

a discharge switch coupled to a lower voltage terminal of said power supply, a second side of the capacitor being connected to the lower voltage terminal of the power supply, the anode of the light emitting diode being connected to a connection point of the charge switch and the capacitor, the cathode of the light emitting diode being connected to the lower voltage terminal of the power supply through said discharge switch; and a controller for closing the charge switch to charge the capacitor when a voltage on the capacitor reaches a preset low voltage threshold and for opening the charge switch when the voltage on the capacitor reaches a preset high voltage threshold, wherein the discharge switch is closed responsive to an intensity of the electrical signal and the capacitor thereby discharges through the light emitting diode to emit an optical signal corresponding to the electrical signal.

8. The optical transmitter of claim 7, wherein the discharge switch comprises an N-type FET having a drain connected to a cathode of the light emitting diode, a source connected to the lower voltage terminal of the power supply and a gate connected to receive the electrical signal.

9. The optical transmitter of claim 7, wherein the controller comprises a voltage comparator having a positive input connected to an output of the voltage comparator through a resistor and connected to the capacitor through a comparator input resistor, an output signal of the voltage comparator controlling the charge switch and a threshold voltage applied to the voltage comparator determining the preset low voltage threshold and the preset high voltage threshold.

10. The optical transmitter of claim 9, wherein the controller further comprises a voltage divider applying a divided voltage to the comparator input resistor.

11. The optical transmitter of claim 10, wherein the voltage divider comprises a first N-type FET having a drain connected to the capacitor, and a source and gate connected to the comparator input resistor and to a drain of a second N-type FET, a source and gate of the second N-type FET being connected to the lower voltage terminal of the power supply.

12. The optical transmitter of claim 10, wherein the charge switch comprises a P-type FET having a source connected to the higher voltage terminal of the power supply, a drain connected to the capacitor, and a gate connected to the output of the voltage comparator.

13. A circuit for a light emitting diode, comprising:

a first switch;

a charge storage device having a first side connected to a higher voltage terminal of a power supply through said first switch;

a second switch coupled to a lower voltage terminal of said power supply, a second side of the charge storage device being connected to the lower voltage terminal of the power supply, the anode of the light emitting diode being connected to a connection point of the first switch and the charge storage device, the cathode of the light emitting diode being connected to said lower voltage terminal of the power supply through said second switch; and a controller for closing the first switch to charge the charge storage device when a voltage on the charge storage device reaches a preset low voltage threshold and for opening the first switch when the voltage on the charge storage device reaches a preset high voltage threshold.

14. The circuit of claim 13, wherein the second switch comprises an N-type FET having a drain connected to a cathode of the light emitting diode, a source connected to receive the lower voltage terminal of the power supply and a gate connected to the electrical signal.

15. The circuit of claim 13, wherein the controller comprises a voltage comparator having a positive input connected to an output of the voltage comparator through a resistor and connected to the charge storage device through a comparator input resistor, an output signal of the voltage comparator controlling the first switch and a threshold voltage applied to the voltage comparator determining the preset low voltage threshold and the preset high voltage threshold.

16. The circuit of claim 15, wherein the controller further comprises a voltage divider applying a divided voltage to the comparator input resistor.

17. The circuit of claim 16, wherein the voltage divider comprises a first N-type FET having a drain connected to the charge storage device, and a source and gate connected to the comparator input resistor and to a drain of a second N-type FET,
 a source and gate of the second N-type FET being connected to the lower voltage terminal of the power supply.

18. The circuit of claim 16, wherein the first switch comprises a P-type FET having a source connected to the higher voltage terminal of the power supply,
 a drain connected to the charge storage device, and a gate connected to the output of the voltage comparator.

19. The circuit of claim 13, wherein the second switch is closed responsive to an intensity of an electrical signal and the charge storage device thereby discharges through the light emitting diode to emit an optical signal corresponding to the electrical signal.

20. The circuit of claim 13, wherein said first switch comprises a charge switch and said second switch comprises a discharge switch.

* * * * *